(12) United States Patent
Redaelli

(10) Patent No.: US 11,205,681 B2
(45) Date of Patent: *Dec. 21, 2021

(54) MEMORY FOR EMBEDDED APPLICATIONS

(71) Applicant: Micron Technology, Inc., Boise, ID (US)

(72) Inventor: Andrea Redaelli, Casatenovo (IT)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 17/108,795

(22) Filed: Dec. 1, 2020

(65) Prior Publication Data

US 2021/0183946 A1   Jun. 17, 2021

Related U.S. Application Data

(63) Continuation of application No. 16/848,200, filed on Apr. 14, 2020, now Pat. No. 10,868,080, which is a (Continued)

(51) Int. Cl.
*G11C 16/04* (2006.01)
*H01L 27/24* (2006.01)
(Continued)

(52) U.S. Cl.
CPC .......... *H01L 27/2409* (2013.01); *G11C 5/025* (2013.01); *G11C 11/4085* (2013.01);
(Continued)

(58) Field of Classification Search
CPC . G11C 5/025; G11C 11/4085; G11C 11/4087; G11C 13/0026; G11C 13/0028
See application file for complete search history.

(56) References Cited

U.S. PATENT DOCUMENTS 7,998,357 B2   8/2011   Cho et al.
8,854,890 B1*  10/2014  Miwa .................. G11C 16/0483
                                                          365/185.18
(Continued)

OTHER PUBLICATIONS

ISA/KR, International Search Report and Written Opinion of the International Searching Authority, Int'l. Appl. No. PCT/US2019/054481, dated Jan. 21, 2020, Korean Intellectual Property Office, Seo-gu, Daejeon, Republic of Korea, 10 pgs.

*Primary Examiner* — Pho M Luu
(74) *Attorney, Agent, or Firm* — Holland & Hart LLP

(57) ABSTRACT

Memory devices for embedded applications are described. A memory device may include an array of memory cells having a first area and configured to operate at a first voltage, and circuitry having a second area that at least partially overlaps the first area. The circuitry may be configured to operate at a second voltage lower than the first voltage. The circuitry maybe be further configured to access the array of memory cells using decoder circuitry configured to operate at the first voltage. The array of memory cells and the circuitry may be on a single substrate. The circuitry may include microcontroller circuitry, cryptographic controller circuitry, and/or memory controller circuitry. The memory cells may be self-selecting memory cells that each include a storage and selector element having a chalcogenide material. The memory cells may not include separate cell selector circuitry.

20 Claims, 6 Drawing Sheets

Related U.S. Application Data continuation of application No. 16/164,141, filed on Oct. 18, 2018, now Pat. No. 10,658,427.

(51) Int. Cl.
*H01L 45/00* (2006.01)
*H01L 27/108* (2006.01)
*G11C 5/02* (2006.01)
*G11C 13/00* (2006.01)
*G11C 11/408* (2006.01)

(52) U.S. Cl.
CPC ...... *G11C 11/4087* (2013.01); *G11C 13/0004* (2013.01); *G11C 13/0026* (2013.01); *G11C 13/0028* (2013.01); *H01L 27/10805* (2013.01); *H01L 45/144* (2013.01); *H01L 45/145* (2013.01)

(56) References Cited

U.S. PATENT DOCUMENTS

| | | |
|---|---|---|
| 9,025,394 B2 | 5/2015 | Lin et al. |
| 9,697,874 B1 | 7/2017 | Asnaashari et al. |
| 9,847,118 B1 | 12/2017 | Won |
| 10,535,409 B2 * | 1/2020 | Heinrich-Barna ..... G11C 16/10 |
| 10,658,427 B2 * | 5/2020 | Redaelli ............. G11C 13/0028 |
| 10,868,080 B2 * | 12/2020 | Redaelli ............. G11C 13/0028 |
| 2007/0206419 A1 | 9/2007 | Makino |
| 2013/0058152 A1 | 3/2013 | Pellizer et al. |
| 2013/0148411 A1 | 6/2013 | Atsumi et al. |
| 2018/0286921 A1 | 10/2018 | Redaelli et al. |
| 2018/0294312 A1 | 10/2018 | Pellizzer et al. |
| 2020/0127050 A1 | 4/2020 | Redaelli |

* cited by examiner

MEMORY FOR EMBEDDED APPLICATIONS

CROSS REFERENCE

The present Application for Patent is a continuation of U.S. patent application Ser. No. 16/848,200 by Redaelli, entitled "MEMORY FOR EMBEDDED APPLICATIONS," filed Apr. 14, 2020 and issued on Dec. 15, 2020 as U.S. Pat. No. 10,868,080, which is a continuation of U.S. patent application Ser. No. 16/164,141 by Redaelli, entitled "MEMORY FOR EMBEDDED APPLICATIONS," filed Oct. 18, 2018 and issued on May 19, 2020 as U.S. Pat. No. 10,658,427, each of which is assigned to the assignee hereof and each of which is expressly incorporated by reference in its entirety herein.

BACKGROUND

The following relates generally to memory devices and more specifically to memory for embedded applications.

Memory devices are widely used to store information in various electronic devices such as computers, cameras, digital displays, and the like. Information is stored by programming different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read only memory (ROM), static RAM (SRAM), dynamic RAM (DRAM), synchronous dynamic RAM (SDRAM), ferroelectric RAM (FeRAM), magnetic RAM (MRAM), resistive RAM (RRAM), flash memory, phase change memory (PCM), self-selecting memory (SSM), and others. Memory devices may be volatile or non-volatile. Non-volatile memory cells may maintain their stored logic state for extended periods of time even in the absence of an external power source. Volatile memory cells may lose their stored state over time unless they are periodically refreshed by an external power source.

Improving memory devices, generally, may include increasing memory cell density, increasing read/write speeds, increasing reliability, increasing data retention, reducing power consumption, or reducing manufacturing costs, among other metrics. Techniques for reducing the silicon area (e.g., footprint) for a memory array and additional circuitry, such as controller circuitry, may be desirable for some applications, such as embedded applications.

DETAILED DESCRIPTION

Figure 1:
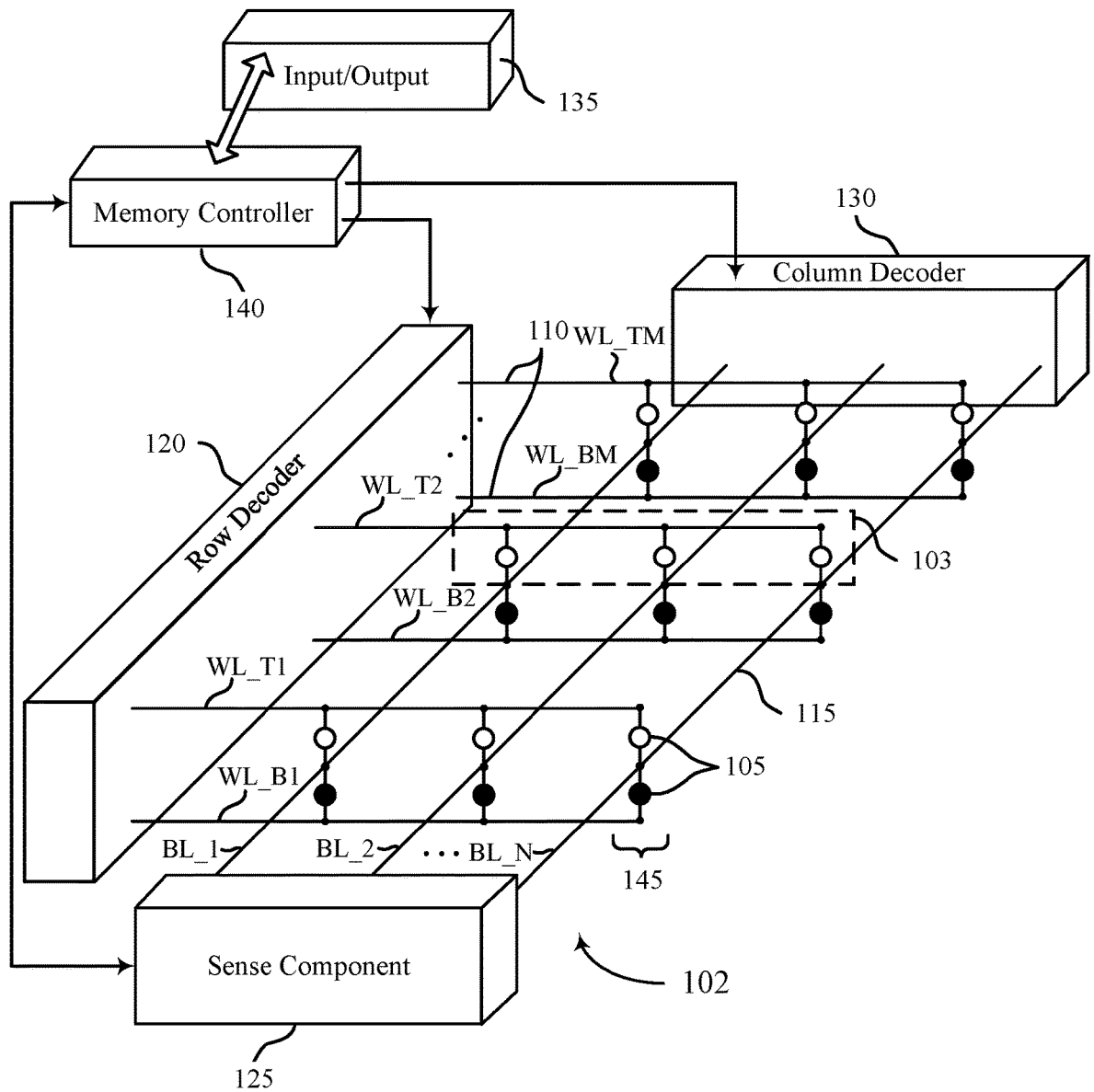
FIG. 1 illustrates an example memory device in accordance with examples of the present disclosure.

Embedded applications such as consumer devices (e.g., smart phones and other portable devices), automotive systems, and industrial systems typically include a memory system and a microcontroller along with various other types of circuitry to implement needed functions. Embedded applications often have tight constraints on size (e.g., area, footprint) and/or on power consumption. Thus, chips or dice that integrate a memory system and other circuitry within a small footprint may be desirable, for embedded applications or other applications.

Some types of memory cells, such as DRAM, may include cell selector circuitry to access a memory cell. For example, each memory cell may include a corresponding transistor for selecting the cell. Such selector circuitry is typically fabricated on a substrate underneath the array of memory cells and directly coupled with the memory cells. In contrast, a self-selecting memory (SSM) cell may be a memory cell that includes a single, self-selecting material—such as chalcogenide material—that may be configured to act as both a selector element and as a memory (storage) element. Thus, SSM cells may not include separate cell selector circuitry. This may free up the area underneath an SSM memory array for other types of circuitry. For example, controller circuitry and/or decoder circuitry may be fabricated underneath the memory array instead of selector circuitry, thereby reducing the total area or footprint of the memory array and the controller and/or decoder circuitry. This area reduction may be particularly desirable in the context of embedded applications.

Fabricating circuitry under an array of SSM cells may have other advantages. For example, in some cases, circuitry that is fabricated underneath an array of memory cells may be electrically shielded from external (e.g., off-chip, off-device) sensors, thus potentially providing security against external sensing or "hacking." Such shielding may be particularly valuable for controller circuitry, such as for a memory controller, microcontroller or other host processor, or cryptographic controller (e.g., a crypto-controller).

Various methods and devices that implement memory and other circuitry for embedded applications are described herein. In some cases, a memory device may include an array of memory cells that has a first area and is configured to operate at a first voltage. The device may include additional circuitry, such as controller circuitry, that has a second area that overlaps the first area. The array of memory cells and the circuitry may be on a single substrate. The circuitry may be fabricated in a layer underneath the array of memory cells (e.g., in a layer that is closer to the substrate). In some cases, the circuitry may be configured to operate at a lower voltage than the array of memory cells. In some cases, the additional circuitry may be controller circuitry that is configured to access the array of memory cells using decoder circuitry that is coupled with the array's access lines (e.g., word lines, bit lines).

Because the area of the circuitry may overlap the area of the array or memory cells, the total footprint of the array and the circuitry may be smaller than if the circuitry were located entirely outside of the area of the memory array. In addition, circuitry located underneath the memory array may experience electromagnetic shielding (e.g., the circuitry may be shielded by the memory array, such as by access lines of the memory array).

In some cases, SSM memory may operate at lower voltages or currents than some other types of memory. Thus, the decoder circuitry for SSM memory cells (e.g., circuitry implementing the word line decoders and/or bit line decoders) may consume less area than decoder circuitry used for other types of memory arrays. In this case, the area for the decoder circuitry may be smaller than the area for the array of memory cells. Thus, the decoder circuitry may be located entirely underneath the array of memory cells (e.g., closer to the substrate than the array of memory cells), without extending beyond the boundaries of the array of memory cells. The remaining area under the array of memory cells (e.g., the area not used by the decoder circuitry) may be used for other types of circuitry, such as controller circuitry.

In some cases, a memory device may include an array of memory cells that has a first area. The device may include decoder circuitry that has a second area that is smaller than the first area and overlaps the first area. The array of memory cells and the decoder circuitry may be on a single substrate. The decoder circuitry may be fabricated in a layer underneath the memory array (e.g., in a layer that is closer to the substrate). In some cases, the decoder circuitry may be coupled with access lines (word lines, bit lines) of the memory array. In some cases, the array of memory cells may overlap all of the decoder circuitry; e.g., the decoder circuitry may not extend beyond the boundaries of the array of memory cells.

Features of the disclosure introduced above are further described herein in the context of memory arrays. Specific examples are then described for memory devices that include a memory array and additional circuitry. These and other features of the disclosure are further illustrated by and described with reference to apparatus diagrams, system diagrams, and flowcharts that relate to techniques for implementing a memory for embedded applications.

FIG. 1 illustrates an example memory device 100 in accordance with examples of the present disclosure. Memory device 100 may also be referred to as an electronic memory apparatus. FIG. 1 is an illustrative representation of various components and features of the memory device 100. As such, it should be appreciated that the components and features of the memory device 100 are shown to illustrate functional interrelationships, not actual physical positions within the memory device 100. In the illustrative example of FIG. 1, the memory device 100 includes a three-dimensional (3D) memory array 102. The 3D memory array 102 includes memory cells 105 that may be programmable to store different states. In some examples, each memory cell 105 may be programmable to store one of two states, denoted as a logic 0 and a logic 1. In some examples, a memory cell 105 may be configured to store one of more than two logic states. Although some elements included in FIG. 1 are labeled with a numeric indicator, other corresponding elements are not labeled, though they are the same or would be understood to be similar, in an effort to increase visibility and clarity of the depicted features.

A memory cell 105 may, in some examples, be a self-selecting memory cell. A self-selecting memory cell 105 may include a chalcogenide material that is used as both a storage element and a cell selector element, thus eliminating the need for separate cell selector circuitry. Such an element may be referred to as a storage and selector element. In contrast, other types of memory cells, such as DRAM or PCM cells, may each include a separate cell selector element such as a three-terminal selector element (e.g., a transistor) to select the memory cell. These separate selector elements may be fabricated underneath the DRAM or PCM memory cells, for example.

The chalcogenide material used in a self-selecting memory cell may be, for example, an alloy of selenium (Se), tellurium (Te), arsenic (As), antimony (Sb), carbon (C), germanium (Ge), and silicon (Si). In some example, a chalcogenide material having primarily selenium (Se), arsenic (As), and germanium (Ge) may be referred to as SAG-alloy. In some examples, SAG-alloy may include silicon (Si) and such chalcogenide material may be referred to as SiSAG-alloy. In some examples, the chalcogenide glass may include additional elements such as hydrogen (H), oxygen (O), nitrogen (N), chlorine (Cl), or fluorine (F), each in atomic or molecular forms.

In some cases, the chalcogenide material used in a self-selecting memory cell may be based on an alloy (such as the alloys listed above) and may be operated so as to not undergo a phase change during normal operation of the memory cell (e.g., due to the composition of the chalcogenide material, and/or due to operational voltages and currents configured to maintain the chalcogenide material in a single phase, such as an amorphous or glass phase). For example, the chalcogenide material may include a chemical element, such as arsenic, that inhibits crystallization of the chalcogenide material and thus may remain in an amorphous state.

The 3D memory array 102 may include two or more two-dimensional (2D) memory arrays 103 formed on top of one another. This may increase a number of memory cells that may be placed or created on a single die or substrate as compared with 2D arrays, which in turn may reduce production costs, or increase the performance of the memory device, or both. The memory array 102 may include two levels of memory cells 105 and may thus be considered a 3D memory array; however, the number of levels is not limited to two. Each level may be aligned or positioned so that memory cells 105 may be aligned (exactly, overlapping, or approximately) with one another across each level, forming a memory cell stack 145. In some cases, the memory cell stack 145 may include multiple self-selecting memory cells laid on top of another while sharing an access line for both as explained below. In some cases, the self-selecting memory cells may be multi-level self-selecting memory cells configured to store more than one bit of data using multi-level storage techniques.

In some examples, each row of memory cells 105 is connected to a word line 110, and each column of memory cells 105 is connected to a bit line 115. In some cases, word lines 110 and bit lines 115 may be referred to as access lines because they may permit access to memory cells 105. Word lines 110 and bit lines 115 may be substantially perpendicular to one another and may create an array of memory cells. As shown in FIG. 1, the two memory cells 105 in a memory cell stack 145 may share a common conductive line such as a bit line 115. That is, a bit line 115 may be in electronic communication with the bottom electrode of the upper memory cell 105 and the top electrode of the lower memory cell 105. Other configurations may be possible, for example, a third layer may share an access line 110 with a lower layer. In general, one memory cell 105 may be located at the intersection of two conductive lines such as a word line 110 and a bit line 115. This intersection may be referred to as a memory cell's address. A target memory cell 105 may be a memory cell 105 located at the intersection of an energized word line 110 and bit line 115; that is, word line 110 and bit line 115 may be energized to read or write a memory cell 105 at their intersection. Other memory cells 105 that are in electronic communication with (e.g., connected to) the same word line 110 or bit line 115 may be referred to as untargeted memory cells 105.

As discussed above, electrodes may be coupled to a memory cell 105 and an access line 110 or a bit line 115. The term electrode may refer to an electrical conductor, and in some cases, may be employed as an electrical contact to a memory cell 105. An electrode may include a trace, wire, conductive line, conductive layer, or the like that provides a conductive path between elements or components of memory device 100. In some examples, a memory cell 105 may include a chalcogenide material positioned between a first electrode and a second electrode. As previously noted, for SSM memory cells, the chalcogenide material may be used as both a storage element (e.g., to store a state of memory cell 105) and as a selector element (e.g., to select the memory cell 105).

One side of the first electrode may be coupled to a word line 110 and the other side of the first electrode to the chalcogenide material. In addition, one side of the second electrode may be coupled to a bit line 115 and the other side of the second electrode to the chalcogenide material. The first electrode and the second electrode may be the same material (e.g., carbon) or a different material. In some cases, the electrodes may be a different material than the access lines. In some examples, the electrodes may shield the word line 110 and bit line 115 from the chalcogenide material to prevent chemical interaction between the chalcogenide material and the word line 110 and/or bit line 115.

Operations such as reading and writing may be performed on memory cells 105 by activating or selecting a corresponding word line 110 and bit line 115. In some examples, word lines 110 and bit lines 115 may be referred to as access lines, and bit lines 115 may also be known digit lines 115. References to access lines, word lines, and bit lines, or their analogues, are interchangeable without loss of understanding or operation. Activating or selecting a word line 110 or a bit line 115 may include applying a voltage to the respective line. Word lines 110 and bit lines 115 may be made of conductive materials such as metals (e.g., copper (Cu), aluminum (Al), gold (Au), tungsten (W), titanium (Ti)), metal alloys, carbon, conductively-doped semiconductors, or other conductive materials, alloys, compounds, or the like.

Accessing memory cells 105 may be controlled through a row decoder 120 and a column decoder 130. For example, a row decoder 120 may receive a row address from the memory controller 140 and activate the appropriate word line 110 based on the received row address. Such a process may be referred to as decoding a row or word line address. Similarly, a column decoder 130 may receive a column address from the memory controller 140 and activate the appropriate bit line 115. Such a process may be referred to as decoding a column or bit line address. A row decoder 120 and/or column decoder 130 may be examples of decoders implemented using decoder circuitry, for example. In some cases, row decoder 120 and/or column decoder 130 may include charge pump circuitry that is configured to increase a voltage applied to a word line 110 or bit line 115 (respectively).

Memory array 102 may include multiple word lines 110, labeled WL_1 through WL_M, and multiple bit lines 115, labeled BL_1 through BL_N, where M and N depend on the array size. Thus, by activating a word line 110 and a bit line 115, e.g., WL_2 and BL_3, the memory cell 105 at their intersection may be accessed.

In some examples, a memory device may include an array of memory cells 105 that has a first area. The memory device may include decoder circuitry (e.g., implementing word line decoders and/or bit line decoders) having a second area that is smaller than the first area. The decoder circuitry may be located underneath the array of memory cells and may be entirely overlapped by the array of memory cells. In some cases, because the area included by the decoder circuitry is smaller than the area for the array of memory cells, additional circuitry (e.g., controller circuitry) may also be located underneath the array of memory cells. In some cases, the array of memory cells does not require any additional decoder circuitry beyond the boundaries of the array of memory cells.

Upon accessing, a memory cell 105 may be read, or sensed, by sense component 125 to determine the stored state of the memory cell 105. For example, a voltage may be applied to a memory cell 105 (using the corresponding word line 110 and bit line 115) and the presence of a resulting current may depend on the applied voltage and the threshold voltage of the memory cell 105, described in more detail below. In some cases, more than one voltage may be applied. Additionally, if an applied voltage does not result in current flow, other voltages may be applied until a current is detected by sense component 125. By assessing the voltage that resulted in current flow, the stored logic state of the memory cell 105 may be determined. In some cases, the voltage may be ramped up in magnitude until a current flow is detected. In other cases, predetermined voltages may be applied sequentially until a current is detected. Likewise, a current may be applied to a memory cell 105 and the magnitude of the voltage to create the current may depend on the electrical resistance or the threshold voltage of the memory cell 105.

In some examples, a self-selecting memory cell 105 including chalcogenide material may be programmed to store a logic state by applying a first pulse having a first polarity. By way of example, when a particular self-selecting memory cell 105 is programmed, elements within the cell separate, causing ion migration. Ions may migrate towards a particular electrode, depending on the polarity of the pulse applied to the memory cell. For example, in a self-selecting memory cell 105, ions may migrate towards the negative electrode. The memory cell may then be read by applying a voltage across the cell to sense the state of the memory cell. The threshold voltage seen during a read operation may be based on the distribution of ions in the memory cell and the polarity of the read pulse. For example, if a memory cell has a given distribution of ions, the threshold voltage detected during the read operation may be different for a first read pulse with a first polarity than it is with a second read pulse having a second polarity. Depending on the polarity of the memory cell, this concentration of migrating ions may represent a logic "1" or logic "0" state. This description of ion migration represents an example of a mechanism of the self-selecting memory cell for achieving the results described herein. This example of a mechanism should not be considered limiting.

Sense component 125 may include various transistors or amplifiers to detect and amplify a difference in the signals, which may be referred to as latching. The detected logic state of memory cell 105 may then be output through column decoder 130 as output 135. In some cases, sense component 125 may be part of a column decoder 130 or row decoder 120. Or, sense component 125 may be connected to or in electronic communication with column decoder 130 or row decoder 120. An ordinary person skilled in the art would appreciate that sense component may be associated either with column decoder or row decoder without losing its functional purpose.

A memory cell 105 may be set or written by similarly activating the relevant word line 110 and bit line 115 and at least one logic value may be stored in the memory cell 105. Column decoder 130 or row decoder 120 may accept data, for example input/output 135, to be written to the memory cells 105. In the case of a self-selecting memory cell including a chalcogenide material, a memory cell 105 may be written to store data by applying a programming sequence that may include one or more pulses, which may have the same or different polarities.

The memory controller 140 may control the operation (e.g., read, write, re-write, refresh, discharge) of memory cells 105 through the various components, for example, row decoder 120, column decoder 130, and sense component 125. In some cases, one or more of the row decoder 120, column decoder 130, and sense component 125 may be co-located with the memory controller 140. Memory controller 140 may generate row and column address signals to activate the desired word line 110 and bit line 115. Memory controller 140 may also generate and control various voltages or currents used during the operation of memory device 100.

The memory controller 140 may be configured to execute a write operation that can program a self-selecting memory cell. For example, the memory controller 140 may be configured to apply, during a write operation, one or more pulses to memory cell 105.

Figure 2:
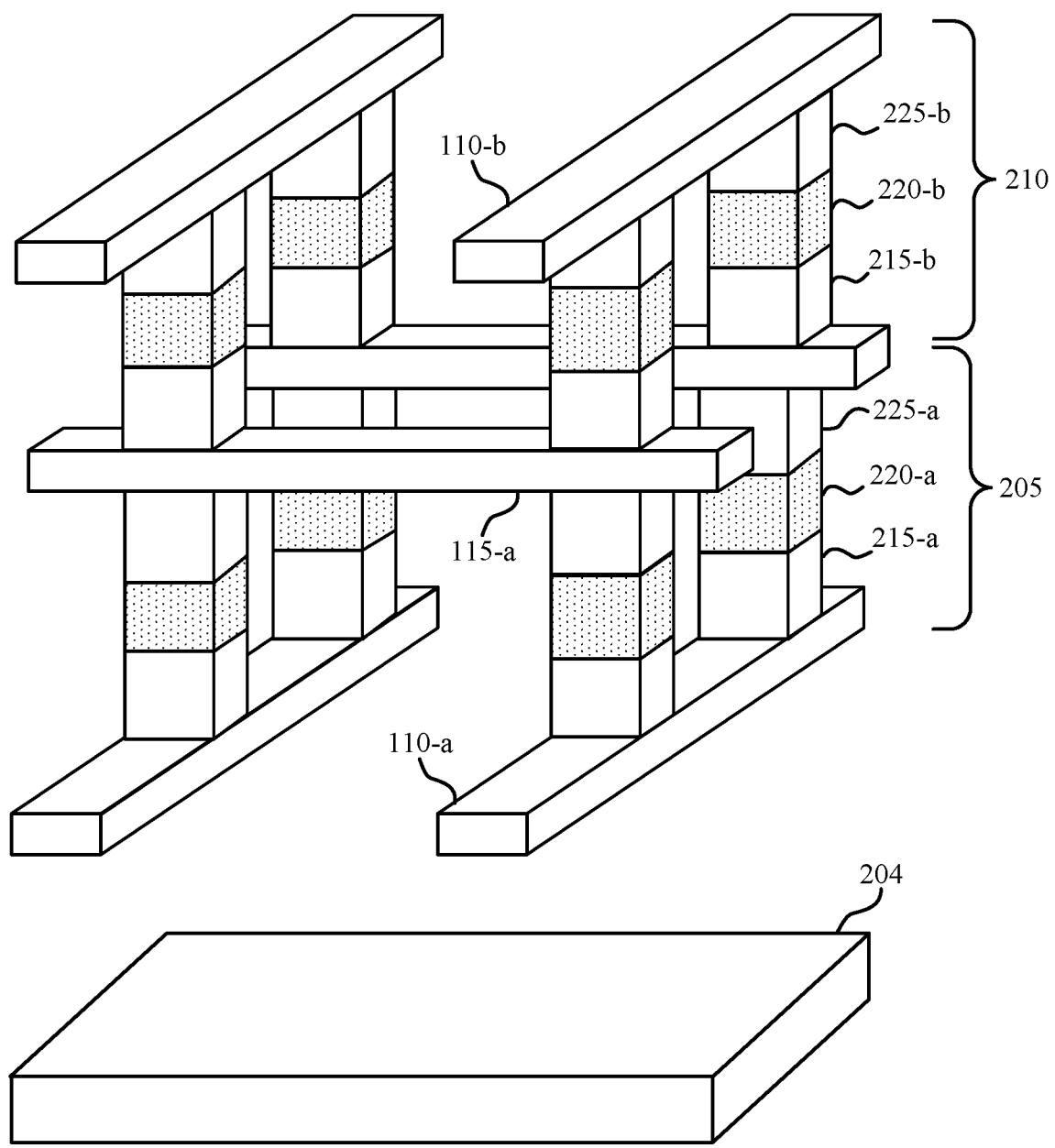
FIG. 2 illustrates an example of a memory array that supports memory for embedded applications in accordance with aspects of the present disclosure.

FIG. 2 illustrates an example of a 3D memory array 200 that supports memory for embedded applications in accordance with aspects of the present disclosure. Memory array 200 may be an example of portions of memory array 102 described with reference to FIG. 1. Memory array 200 may include a first array or deck 205 of memory cells that is positioned above a substrate 204 and second array or deck 210 of memory cells on top of the first array or deck 205. Memory array 200 may also include word line 110-*a* and word line 110-*b*, and bit line 115-*a*, which may be examples of word line 110 and bit line 115, as described with reference to FIG. 1. Memory cells of the first deck 205 and the second deck 210 each may have one or more self-selecting memory cells. Although some elements included in FIG. 2 are labeled with a numeric indicator, other corresponding elements are not labeled, though they are the same or would be understood to be similar, in an effort to increase visibility and clarity of the depicted features.

Self-selecting memory cells of the first deck 205 may include first electrode 215-*a*, chalcogenide material 220-*a*, and second electrode 225-*a*. In addition, self-selecting memory cells of the second deck 210 may include a first electrode 215-*b*, chalcogenide material 220-*b*, and second electrode 225-*b*. The self-selecting memory cells of the first deck 205 and second deck 210 may, in some examples, have common conductive lines such that corresponding self-selecting memory cells of each deck 205 and 210 may share bit lines 115 or word lines 110 as described with reference to FIG. 1. For example, first electrode 215-*b* of the second deck 210 and the second electrode 225-*a* of the first deck 205 may be coupled to bit line 115-*a* such that bit line 115-*a* is shared by vertically adjacent self-selecting memory cells.

The architecture of memory array 200 may be referred to as a cross-point architecture, in some cases, in which a memory cell is formed at a topological cross-point between a word line and a bit line as illustrated in FIG. 2. Such a cross-point architecture may offer relatively high-density data storage with lower production costs compared to other memory architectures. For example, the cross-point architecture may have memory cells with a reduced area and, resultantly, an increased memory cell density compared to other architectures. For example, the architecture may have a 4F2 memory cell area, where F is the smallest feature size, compared to other architectures with a 6F2 memory cell area, such as those with a three-terminal selector element. For example, DRAM may use a transistor, which is a three-terminal device, as the selector element for each memory cell and may have a larger memory cell area compared to the cross-point architecture. Alternatively, DRAM memory cells may include the cell selector elements underneath the memory cells.

While the example of FIG. 2 shows two memory decks, other configurations are possible. In some examples, a single memory deck of self-selecting memory cells may be constructed above a substrate 204, which may be referred to as a two-dimensional memory. In some examples, two or more decks of memory cells may be configured in a similar manner in a three-dimensional cross point architecture.

While the example of FIG. 2 depicts two decks of self-selecting memory cells, in some cases, a multi-deck memory device may include a first deck that includes an array of self-selecting memory cells and a second deck that includes an array of another type of memory cells, such as memory cells in a cross-point configuration with each cell stack comprising a first chalcogenide element configured as a storage element and a second chalcogenide element configured as a selector element.

In some examples, additional circuitry may be fabricated between substrate 204 and first deck 205 (e.g., underneath the array of memory cells). Such additional circuitry may include, for example, decoder circuitry, controller circuitry, or other types of circuitry, as described in more detail with respect to FIGS. 3-6.

Figure 3:
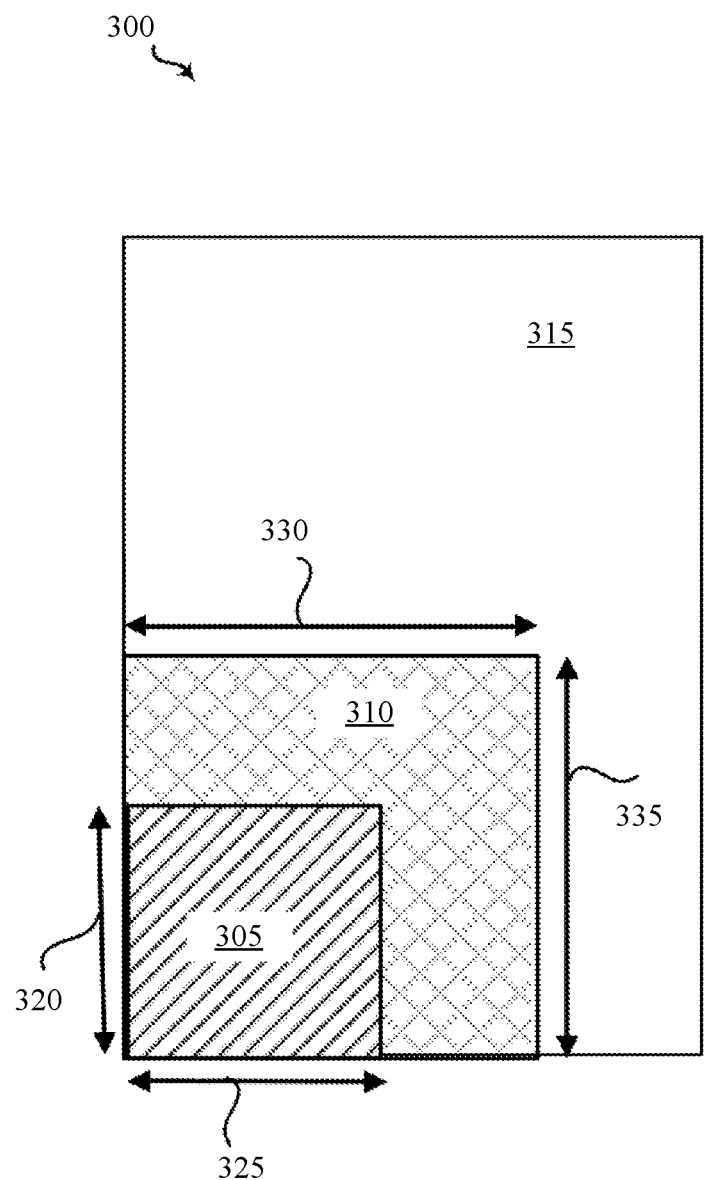
FIG. 3 illustrates an example of a memory device that supports memory for embedded applications in accordance with aspects of the present disclosure.

FIG. 3 illustrates a memory device 300 for embedded applications. Memory device 300 includes decoder circuitry 305, array of memory cells 310, and controller circuitry 315. Decoder circuitry 305, array of memory cells 310, and controller circuitry 315 may all be fabricated on a single substrate or die (chip) and may be enclosed within a single package (e.g., a single chip or multi-chip package).

In some examples, the array of memory cells 310 may be an array of self-selecting memory cells, such as the self-selecting memory cells described with respect to FIGS. 1-2. Each self-selecting memory cell may include a chalcogenide element configured as a storage and selector element for storing a state of the memory cell and selecting the memory cell.

In some examples, decoder circuitry 305 and controller circuitry 315 may be in a first layer of a memory device or die, and array of memory cells 310 may be in a second layer of the memory device or die. The first layer may be underneath the second layer (e.g., closer to the substrate than the second layer), such that the array of memory cells 310 overlays all of the decoder circuitry 305 and, in some cases, some or all of the controller circuitry 315. Such an arrangement is described in more detail with respect to FIG. 4.

In some examples, decoder circuitry 305 may be circuitry that is configured to decode memory addresses and drive (e.g., activate or bias) specific word lines and/or bit lines based on the memory addresses. Thus, decoder circuitry 305 may be coupled with one or more access lines of the array of memory cells 310. In some cases, decoder circuitry 305 may include charge pump circuitry to drive the access lines. The charge pump circuitry may include various capacitors and switches to increase the voltage of the access lines.

In some cases, decoder circuitry 305 may be implemented as metal-oxide-semiconductor (MOS) circuitry configured to operate at a same or similar voltage as the array of memory cells 310 to enable the decoder circuitry 305 to drive the access lines of the array of memory cells 310. In some cases, MOS decoder circuitry may include MOS logic gates (e.g., transistors) having a first gate oxide material and thickness.

In some examples, controller circuitry 315 may include circuitry that is configured to control accesses to the array of memory cells 310 (e.g., memory controller circuitry), and/or to perform arithmetic and logic operations on data stored in the memory cells by accessing the array of memory cells 310 (e.g., programmable microcontroller circuitry), and/or to perform cryptographic encryption/decryption of data stored in the array of memory cells 310 (e.g., cryptographic controller circuitry).

In some cases, controller circuitry 315 may be configured to access the array of memory cells 310 using decoder circuitry 305. For example, memory controller circuitry may provide a memory address to decoder circuitry 305, which may cause decoder circuitry 305 to decode the address and drive appropriate access lines of the array of memory cells 310 to enable the memory controller circuitry to access the array of memory cells 310. For example, programmable microcontroller circuitry and/or cryptographic controller circuitry may be coupled with memory controller circuitry and may be configured to access the array of memory cells 310 using the memory controller circuitry, which may in turn use the decoder circuitry 305 to access the array of memory cells 310.

In some cases, controller circuitry 315 may be implemented as MOS circuitry configured to operate at a lower voltage or lower current than the array of memory cells and/or the decoder circuitry 305. For MOS circuitry, the operating voltage or current may be related to certain characteristics of a gate oxide used to implement the circuitry. For example, in some cases, controller circuitry 315 may include MOS logic gates (e.g., transistors) having a gate oxide that is different than the gate oxide used for the decoder circuitry 305. For example, the gate oxide used for the controller circuitry 315 may be fabricated with a different gate oxide material than the gate oxide used for the decoder circuitry 305. Additionally or alternatively, the gate oxide used for the controller circuitry 315 may be fabricated with a different gate oxide thickness than the thickness of the gate oxide used for the decoder circuitry 305.

As previously noted, SSM cells may operate at a lower programming current than some other types of memory cells (e.g., PCM cells). Thus, the decoder circuitry 305 for SSM cells may be smaller (in terms of area) than decoder circuitry for other types of memory cells and may therefore consume less area than the array of memory cells 310.

In the example of FIG. 3, the decoder circuitry 305 has a length 320 and a width 325 that define an area of decoder circuitry 305. The array of memory cells 310 has a length 335 and a width 330 that define an area of the array of memory cells 310. In some examples, the area of the decoder circuitry 305 overlaps the area of the array of memory cells 310, such that some or all of the decoder circuitry 305 is located underneath the array of memory cells 310 (e.g., closer to the substrate). For example, some or all decoder circuitry in a row decoder 120, some or all decoder circuitry in a column decoder 130, or some or all of the circuitry in a row decoder 120 and a column decoder 130 may be located underneath the array of memory cells 310. While decoder circuitry 305 and array of memory cells 310 are depicted as being rectangular in shape, other shapes (and corresponding areas) are possible.

In the example of FIG. 3, the area of the decoder circuitry 305 is smaller than the area of the array of memory cells 310 and the decoder circuitry 305 may be located entirely underneath the array of memory cells 310; e.g., the decoder circuitry 305 may not extend beyond the boundaries of the array of memory cells 310. In this case, a portion of the area underneath the array of memory cells 310 may be available for other circuitry. In this case, controller circuitry 315 and/or other types of circuitry may occupy some or all of the available portion of the area underneath the array of memory cells 310.

In some cases, a memory device may include multiple types of circuitry that may be configured for different types of functionality than the array of memory cells, the decoder circuitry, and the controller circuitry. Such additional circuitry may include other types of memory cells (e.g., RAM, SRAM, DRAM), for example. In some cases, such circuitry may be MOS circuitry that is configured to operate at the same or lower voltage than the decoder circuitry 305 and array of memory cells 310, for example. In some cases, some or all of the additional circuitry may be located underneath the array of memory cells 310. In some cases, a specific type or types of circuitry may be prioritized for location under the array of memory cells because of the electromagnetic shielding afforded by such a location. For example, it may be desirable to fabricate cryptographic controller circuitry partially or entirely underneath the array of memory cells to reduce the likelihood that cryptographic operations (e.g., operations to encrypt or decrypt data in the array of memory cells) may be detected or reverse-engineered. Similarly, it may be desirable to fabricate microcontroller or memory controller circuitry partially or entirely underneath the array of memory cells to reduce the likelihood that the programming or functionality of the device may be detected or reverse-engineered.

Figure 4:
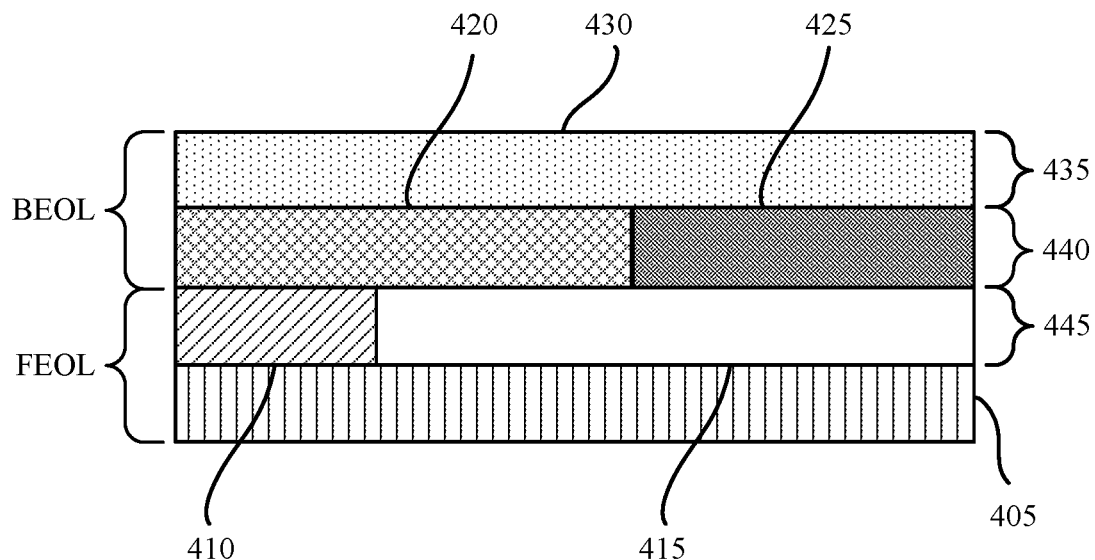
FIG. 4 illustrates an example of a cross section of a memory device that supports memory for embedded applications in accordance with aspects of the present disclosure.

FIG. 4 illustrates an example of a cross-sectional view 400 of a memory device or die, such as memory device 300 described with respect to FIG. 3. The cross-sectional view 400 shows various layers that may be included in a memory device. A memory device may include a substrate 405, decoder circuitry 410, controller circuitry 415, array of memory cells 420, interconnect circuitry 425, and interconnect/pads 430. In some cases, decoder circuitry 410 and controller circuitry 415 are in a first layer 445, and array of memory cells 420 is in a second layer 440. In some cases, the first layer 445 is below (under) the second layer 440; e.g., the first layer 445 is closer to the substrate 405 than the second layer 440. Similarly, the second layer 440 is below (under) the third layer 435.

The array of memory cells 420 may be an example of an array of self-selecting memory cells 105, 310 described with reference to FIGS. 1-3. In some examples, all of the memory cells in the array of memory cells 420 may be accessible using the decoder circuitry 410 underneath the array of memory cells; that is, no additional decoder circuitry may be required to access the full array of memory cells 420.

In some cases, the substrate 405 and the first layer 445 (e.g., including the decoder circuitry 410 and controller circuitry 415) may be fabricated during a front-end-of-line (FEOL) step. In some cases, an FEOL step may include a first portion of an integrated circuit (IC) fabrication process during which individual devices (transistors, capacitors, resistors, etc.) are patterned (e.g., formed) in the semiconductor. In some cases, the array of memory cells 420 may be an array of self-selecting memory cells that may not include transistors or other devices, and therefore may not be fabricated during the FEOL step. In some cases, the FEOL step may not include a metallization step to connect the devices to a metallization layer or wiring. In some cases, the first layer 440 may be referred to as a device layer.

In some cases, the second layer 440 (e.g., including the array of memory cells 420 and interconnect circuitry 425)) may be fabricated during a back-end-of-line (BEOL) step. A BEOL step may include a second portion of an IC fabrication process during which individual devices (transistors, capacitors, resistors, etc.) are interconnected with wiring on the wafer; e.g., fabrication of the metallization layer. The BEOL step may include fabricating an array of self-selecting memory cells. In some cases, the second layer 440 and/or third layer 435 (e.g., include interconnect/pads 430) may be referred to as a metallization layer.

In some cases, the array of memory cells 420 may include a plurality of decks (not shown) of memory cells. Such decks may be similar to the decks 205, 210 depicted in FIG. 2, for example.

In some cases, the controller circuitry 415 may include other components related to the memory device. For example, the controller circuitry 415 may include a memory controller 140 or an input/output 135 system described with reference to FIGS. 1 and 2. In some cases, the controller circuitry 415 may include microcontroller circuitry and/or cryptographic controller circuitry. In some cases, the controller circuitry 415 may be exclusive of (e.g., may not include) row decoders, column decoders, sense amplifiers, or combinations thereof.

Figure 5:
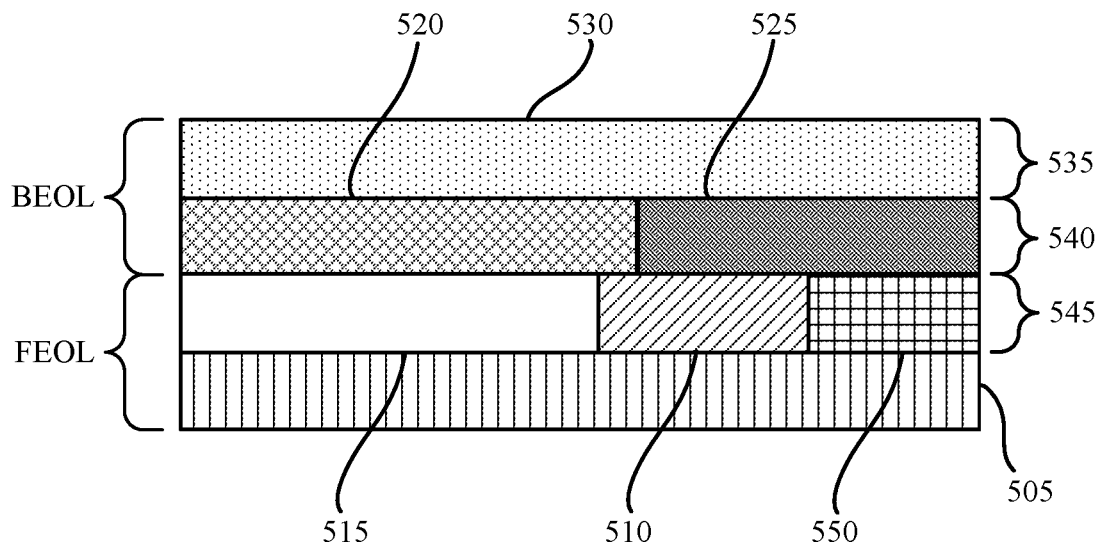
FIG. 5 shows a block diagram of a cross section of a memory device that supports memory for embedded applications in accordance with aspects of the present disclosure.

FIG. 5 illustrates an example of a cross-sectional view 500 of a memory device or die. Cross-sectional view 500 may depict an alternative example of an arrangement of circuitry relative to cross-sectional view 400 discussed with respect to FIG. 4.

Cross-sectional view 500 shows various layers that may be included on a substrate of a memory device. The memory device 500 may include a substrate 505, decoder circuitry 510, controller circuitry 515, SRAM circuitry 550, array of memory cells 520, interconnect circuitry 525, and interconnect/pads 530. In some cases, decoder circuitry 510, controller circuitry 515, and SRAM circuitry 550 are in a first layer 545, and array of memory cells 520 is in a second layer 540. In some cases, the first layer 545 is below (under) the second layer 540; e.g., the first layer 545 is closer to the substrate 505 than the second layer 540. Similarly, the second layer 540 is below (under) the third layer 535.

The array of memory cells 520 may be an example of self-selecting memory cells 105 described with reference to FIGS. 1-2. In the example of FIG. 5, controller circuitry 515 may be fabricated entirely underneath the array of memory cells 520, and decoder circuitry 510 may be fabricated partially underneath array of memory cells 520. SRAM circuitry 550 is not underneath array of memory cells 520. A person of skill in the art will appreciate that the locations and relative sizes of decoder circuitry 510, controller circuitry 515, and SRAM circuitry 550 may vary, such that each of these types of circuits may be entirely underneath, partially underneath, or not underneath the array of memory cells 520 without departing from the scope of the disclosure. In some cases, controller circuitry 515 may be prioritized for fabrication underneath the array of memory cells 520 so that controller circuitry 515 may benefit from the electromagnetic shielding of the array of memory cells 520.

In some cases, the substrate 505 and the first layer 540 (e.g., including the decoder circuitry 510, controller circuitry 515, and SRAM circuitry 550) may be fabricated during a FEOL step. In some cases, the array of memory cells 520 may be an array of self-selecting memory cells that may not include transistors or other devices, and therefore may not be fabricated during the FEOL step. In some cases, the first layer may be referred to as a device layer.

In some cases, the second layer 540 (e.g., including the array of memory cells 520 and interconnect circuitry 525)) may be fabricated during a BEOL step. A BEOL step may include a second portion of an IC fabrication process during which individual devices (transistors, capacitors, resistors, etc.) are interconnected with wiring on the wafer; e.g., fabrication of the metallization layer. The BEOL step may include fabricating the array of self-selecting memory cells. In some cases, the second layer 540 and/or third layer 535 (e.g., including interconnect/pads 530) may be referred to as a metallization layer.

In some cases, the controller circuitry 515 may include other components related to the memory device 500. For example, the controller circuitry 515 may include a memory controller 140 or an input/output 135 system described with reference to FIGS. 1 and 2. In some cases, the controller circuitry 515 may include microcontroller circuitry and/or cryptographic controller circuitry. In some cases, the controller circuitry 515 may be exclusive of (e.g., may not include) row decoders, column decoders, sense amplifiers, or combinations thereof.

Figure 6:
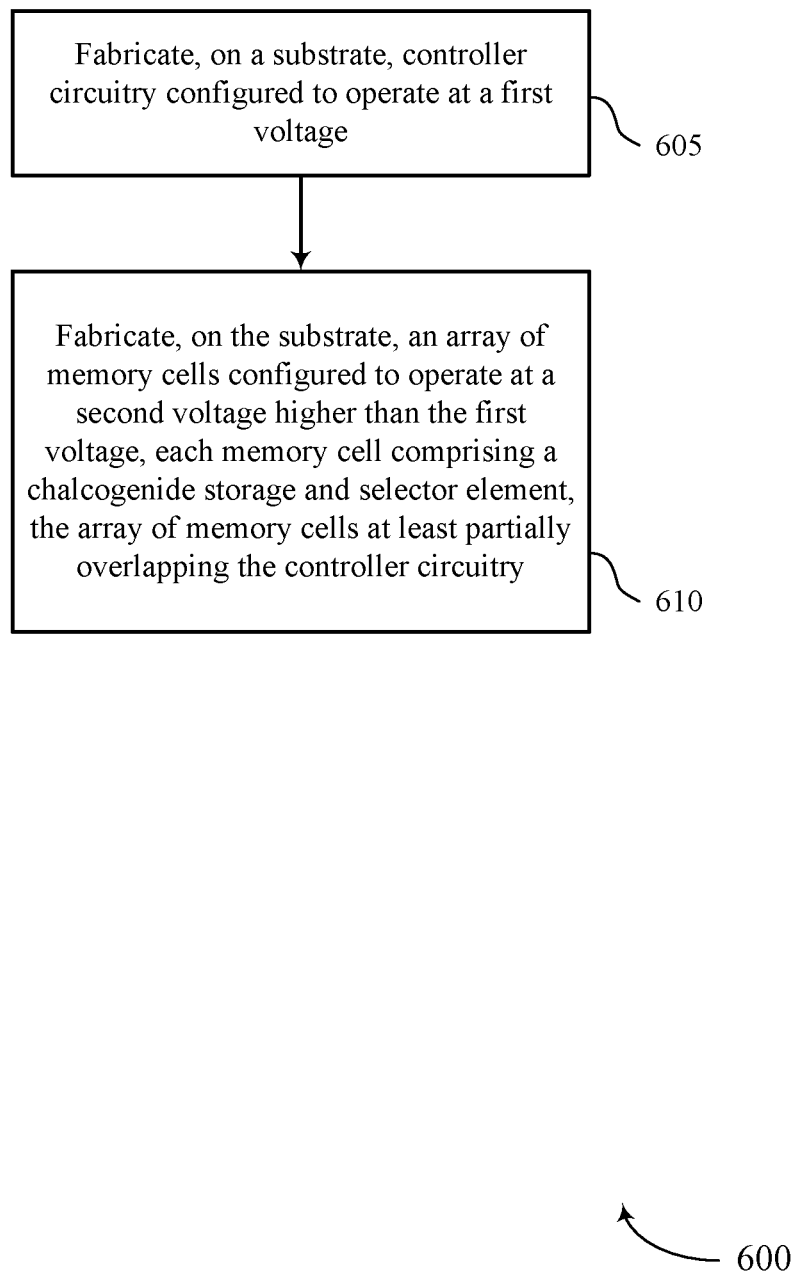
FIG. 6 illustrates a method that supports memory for embedded applications in accordance with aspects of the present disclosure.

FIG. 6 shows a flowchart illustrating a method 600 that supports memory for embedded applications in accordance with aspects of the present disclosure.

At 605, the method may include fabricating, on a substrate (e.g., substrate 204, 405, 505), controller circuitry (e.g., controller circuitry 415, 515) configured to operate at a first voltage. In some cases, fabricating the controller circuitry may include patterning the controller circuitry on the substrate in a FEOL fabrication step.

At 610, the method may include fabricating, on the substrate, an array of memory cells (e.g., array of memory cells 310, 420, 520) configured to operate at a second voltage higher than the first voltage. In some cases, each memory cell may include a chalcogenide storage and selector element. In some cases, the array of memory cells may at least partially overlap the controller circuitry. In some cases, the array of memory cells may be fabricated in a BEOL fabrication step.

A method is described. In some examples, the method may include fabricating, on a substrate, controller circuitry configured to operate at a first voltage, and fabricating, on the substrate, an array of memory cells configured to operate at a second voltage higher than the first voltage. In some examples, each memory cell includes a chalcogenide storage and selector element. In some examples, the array of memory cells at least partially overlaps the controller circuitry. In some examples, fabricating the controller circuitry includes fabricating transistors in a device layer over the substrate during a first fabrication step. In some examples, fabricating the array of memory cells includes fabricating the array of memory cells in a metallization layer over the device layer during a second fabrication step.

The method may include fabricating decoder circuitry in the device layer. In some examples, the decoder circuitry is configured to decode addresses for the array of memory cells and includes MOS logic gates having a first gate oxide. In some examples, the controller circuitry includes MOS logic gates having a second gate oxide different than the first gate oxide. In some examples, the second gate oxide has a different thickness or a different material composition than the first oxide. In some examples, the array of memory cells overlaps a first portion of the controller circuitry and a second portion of the controller circuitry extends beyond the array of memory cells. In some examples, the array of memory cells overlaps all of the controller circuitry.

An apparatus is described. In some examples, the apparatus may support means for fabricating, on a substrate, controller circuitry configured to operate at a first voltage, and fabricating, on the substrate, an array of memory cells configured to operate at a second voltage higher than the first voltage. In some examples, each memory cell includes a chalcogenide storage and selector element. In some examples, the array of memory cells at least partially overlaps the controller circuitry. In some examples, the means for fabricating the controller circuitry includes means for fabricating transistors in a device layer over the substrate during a first fabrication step. In some examples, the means for fabricating the array of memory cells includes means for fabricating the array of memory cells in a metallization layer over the device layer during a second fabrication step.

The apparatus may support means for fabricating decoder circuitry in the device layer. In some examples, the decoder circuitry is configured to decode addresses for the array of memory cells and includes MOS logic gates having a first gate oxide. In some examples, the controller circuitry includes MOS logic gates having a second gate oxide different than the first gate oxide. In some examples, the second gate oxide has a different thickness or a different material composition than the first oxide. In some examples, the array of memory cells overlaps a first portion of the controller circuitry and a second portion of the controller circuitry extends beyond the array of memory cells. In some examples, the array of memory cells overlaps all of the controller circuitry.

It should be noted that the methods described herein describe possible implementations, and that the operations and the steps may be rearranged or otherwise modified and that other implementations are possible. Further, aspects from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The term "electronic communication" and "coupled" refer to a relationship between components that support electron flow between the components. This may include a direct connection between components or may include intermediate components. Components in electronic communication or coupled to one another may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication or may be coupled regardless of the state of the switch (i.e., open or closed).

As used herein, the term "substantially" means that the modified characteristic (e.g., a verb or adjective modified by the term substantially) need not be absolute but is close enough so as to achieve the advantages of the characteristic.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory array 102.

The devices discussed herein, including the memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The various illustrative blocks and modules described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A memory device, comprising:
an array of memory cells having a first area and configured to operate at a first voltage; and
circuitry having a second area that at least partially overlaps the first area, the circuitry configured to operate at a second voltage lower than the first voltage, wherein the array of memory cells and the circuitry are on a single substrate.

2. The memory device of claim 1, further comprising:
decoder circuitry coupled with an access line of the array of memory cells and configured to decode memory addresses for the array of memory cells, wherein the decoder circuitry is configured to operate at the first voltage and the circuitry is configured to access the array of memory cells using the decoder circuitry.

3. The memory device of claim 2, wherein the circuitry comprises microcontroller circuitry configured to perform logic operations based at least in part on accessing the array of memory cells.

4. The memory device of claim 2, wherein the circuitry comprises cryptographic controller circuitry or memory controller circuitry.

5. The memory device of claim 1, wherein the circuitry comprises SRAM circuitry or DRAM circuitry.

6. The memory device of claim 1, wherein the circuitry overlays a third area of the substrate and the array of memory cells overlays a fourth area of the substrate, at least a first portion of the third area coinciding with the fourth area and at least a second portion of the third area extending beyond the fourth area.

7. The memory device of claim 1, wherein the circuitry overlays a third area of the substrate and the array of memory cells overlays a fourth area of the substrate, the third area entirely within the fourth area.

8. A memory device, comprising:
an array of memory cells having a first area; and
decoder circuitry having a second area, the decoder circuitry coupled with an access line of the array of memory cells, wherein the first area at least partially overlaps the second area and the array of memory cells and the decoder circuitry are on a single substrate.

9. The memory device of claim 8, wherein the decoder circuitry is fabricated in a first layer of the memory device and the array of memory cells is fabricated in a second layer of the memory device that is above the first layer.

10. The memory device of claim 9, further comprising:
controller circuitry fabricated in the first layer and configured to access the array of memory cells using the decoder circuitry, wherein the array of memory cells overlaps at least a portion of the controller circuitry.

11. The memory device of claim 10, wherein the decoder circuitry is configured to operate at a first voltage and the controller circuitry is configured to operate at a second voltage lower than the first voltage.

12. The memory device of claim 10, wherein the decoder circuitry comprises logic gates having a first gate oxide material and the controller circuitry comprises logic gates having a second gate oxide material different than the first gate oxide material.

13. The memory device of claim 10, wherein the decoder circuitry comprises logic gates having a first thickness of a first gate oxide material and the controller circuitry comprises logic gates having a second thickness of a second gate oxide material, the first thickness different than the second thickness.

14. The memory device of claim 9, further comprising:
interconnect circuitry fabricated in the second layer and coupled with the array of memory cells and an input/output connector of the memory device.

15. The memory device of claim 8, wherein the array of memory cells overlaps all of the decoder circuitry.

16. The memory device of claim 8, wherein a first deck of the memory device comprises the array of memory cells and the decoder circuitry, further comprising:
   a second deck of the memory device comprising a second array of memory cells that overlaps at least a portion of second decoder circuitry, the second deck and the first deck contained in a single package.

17. The memory device of claim 8, wherein a first deck of the memory device comprises the array of memory cells and the decoder circuitry, further comprising:
   a second deck of the memory device comprising a second array of memory cells, the second array of memory cells comprising PCM cells or DRAM cells, the second deck and the first deck contained in a single package.

18. A memory device, comprising:
   an array of memory cells positioned in a first layer above the substrate; and
   decoder circuitry positioned in a second layer above the first layer, the decoder circuitry coupled with the array of memory cells, the array of memory cells at least partially overlapping the decoder circuitry.

19. The memory device of claim 18, further comprising:
   a controller coupled with the decoder circuitry, the controller configured to cause the memory device to access a memory cell of the array of memory cells using the decoder circuitry.

20. The memory device of claim 19, wherein the controller is positioned in the second layer.

* * * * *